United States Patent [19]
Leroy et al.

[11] Patent Number: 5,461,545
[45] Date of Patent: Oct. 24, 1995

[54] PROCESS AND DEVICE FOR HERMETIC ENCAPSULATION OF ELECTRONIC COMPONENTS

[75] Inventors: Michel Leroy, Chatou; Christian Val, St Remy Les Chevreuses, both of France

[73] Assignee: Thomson-CSF, Puteaux, France

[21] Appl. No.: 305,424

[22] Filed: Sep. 13, 1994

Related U.S. Application Data

[63] Continuation of Ser. No. 844,631, filed as PCT/FR91/00688, Aug. 23, 1991, abandoned.

[30] Foreign Application Priority Data

Aug. 24, 1990 [FR] France .................................. 90 10631

[51] Int. Cl.[6] ...................................................... H05K 1/16
[52] U.S. Cl. ...................... 361/765; 361/750; 361/751; 361/795; 174/52.3; 174/17.05; 257/787; 257/788
[58] Field of Search ........................... 361/748, 750–752, 361/760–762, 765, 795, 796; 257/678, 686, 787, 788, 789, 790, 791; 174/17.05, 52.2, 52.3

[56] References Cited

U.S. PATENT DOCUMENTS 4,063,349 12/1977 Passler .

4,300,184 11/1981 Colla .

FOREIGN PATENT DOCUMENTS

| 0308676 | 3/1989 | European Pat. Off. . | |
|---|---|---|---|
| 60-160145 | 8/1985 | Japan | 257/678 |
| 278299 | 3/1990 | Japan . | |
| 2106055 | 4/1990 | Japan | 257/669 |
| 956001 | 4/1964 | United Kingdom . | |

OTHER PUBLICATIONS

IEEE Transactions on Parts, vol. PHP13, No. 3, Sep. 1977, pp. 273–279.

*Primary Examiner*—Leo P. Picard
*Assistant Examiner*—Y. Whang
*Attorney, Agent, or Firm*—Roland Plottel

[57] ABSTRACT

According to an embodiment of the invention the discrete or integrated electronic components are encapsulated, each in a package, for example a plastic one; the packages are then mounted on a printed circuit board, for example an epoxy one. The components and board as a whole are covered with a relatively thick first layer consisting of an organic compound and ensuring a levelling function, followed by a second layer such as an inorganic metal compound, the function of which is to ensure the hermetic sealing of the whole.

12 Claims, 4 Drawing Sheets

PROCESS AND DEVICE FOR HERMETIC ENCAPSULATION OF ELECTRONIC COMPONENTS

This application is a continuation, of application Ser. No. 844,631, filed as PCT/FR91/00688, Aug. 23, 1991 abandoned.

BACKGROUND OF THE INVENTION

1. Field of the Invention

The present invention relates to a device ensuring an encapsulation of electronic components, encapsulation which is hermetic, that is to say which does not allow gases and, very particularly, water vapour, to pass through.

2. Description of Related Art

In fact, as is known, the problem of eliminating or, at least, limiting moisture in the atmosphere surrounding electronic components is an acute problem.

It is known that the contaminant playing the greatest and most detrimental part with regard to the reliability of a discrete component or of an integrated circuit is the water content of the surrounding environment. In fact, moisture is especially liable to corrode the connecting contacts of the circuits; it also allows ions to solubilise and this reinforces the corrosion. These effects are highly sensitive in the case of integrated circuits and are all the more so the greater the scale of integration, that is to say the smaller the connecting contacts.

In the case of high-performance applications in a severe environment, such as military or space applications, it is known to employ component packages in which the base is made of ceramic and the cover made of metal sealed hermetically onto the base, a degassing operation being, moreover, generally provided before the cover is closed. A disadvantage of this solution is its cost of manufacture, which is very high.

Furthermore, encapsulating packages made of plastic are known, the cost of which is much lower but which have the disadvantage of not being hermetic.

SUMMARY OF THE INVENTION

The object of the present invention is an encapsulation of electronic components which is at the same time hermetic, simple to manufacture and inexpensive.

To this end, the components (such as semiconductor chips) are covered:

- with a first, relatively thick layer of an organic material which substantially levels the relief and blunts the angles of the component;
- with a second layer of an inorganic material, which may be much thinner, which provides the hermetic sealing of the whole. This process applies to components taken individually, as well as to the components (optionally already encapsulated) mounted on a printed circuit board; it is then applied to the board and components as a whole.

As a result, the chips can be easily mounted on the board by means of their packages, this being done, in any known manner, with the aid of inexpensive materials (packages and printed board); the hermetic sealing is ensured by the second layer and the whole is relatively low in cost, on the one hand because of the choice of the materials (packages and/or printed board) and, on the other hand, because this technique can be applied directly to any board carrying an electronic circuit, without the need for relocation of the components with a view, for example, to providing a space for the means ensuring the sealing.

Other objectives, special features and results of the invention will emerge from the following description, given by way of nonlimiting example and illustrated by the attached drawings, which show:

BRIEF DESCRIPTION OF THE DRAWING

In these various figures, on the one hand the same references refer to the same elements and, on the other hand, the actual scale is not adhered to for the sake of clarity of the description.

DESCRIPTION OF PREFERRED EMBODIMENTS

Figure 1:
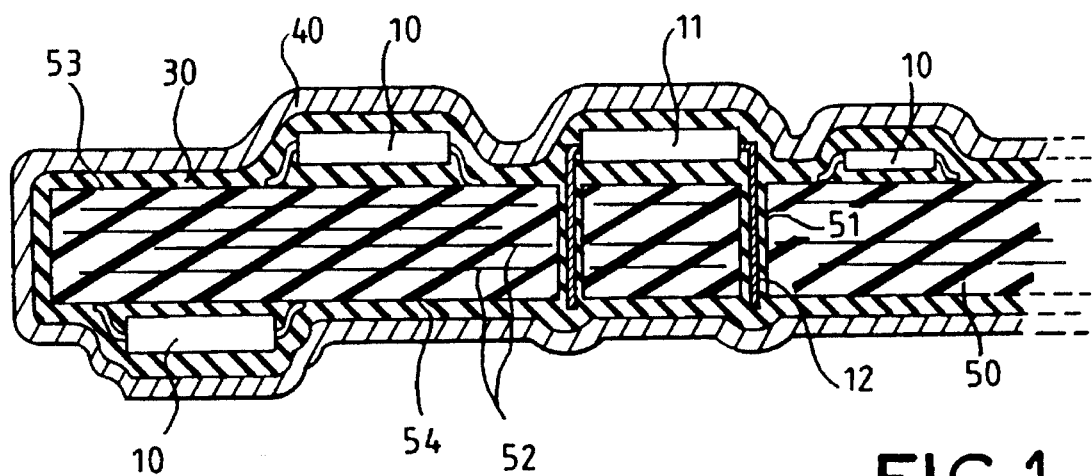
FIG. 1, an embodiment of the device according to the invention.

FIG. 1 shows, therefore, an embodiment of the device according to the invention and will be described in relation to FIG. 2, which illustrates the various steps of its manufacture.

In this embodiment, electronic components such as semiconductor chips forming discrete components or integrated circuits are conventionally encapsulated in packages (step 21, FIG. 2) but, since hermetic sealing is ensured otherwise, the component packages themselves do not need to be hermetic; it is thus possible to use any type of package, for example plastic packages, the cost of which is known to be very markedly lower than that of ceramic packages. Also according to the invention it is possible to employ either packages intended to be mounted flat, such packages being referenced 10 in FIG. 1, or packages provided with connecting lugs (or pins), packages referenced 11 in FIG. 1, with lugs 12, intended to pass through the printed circuit board on which they are mounted.

Figure 2:
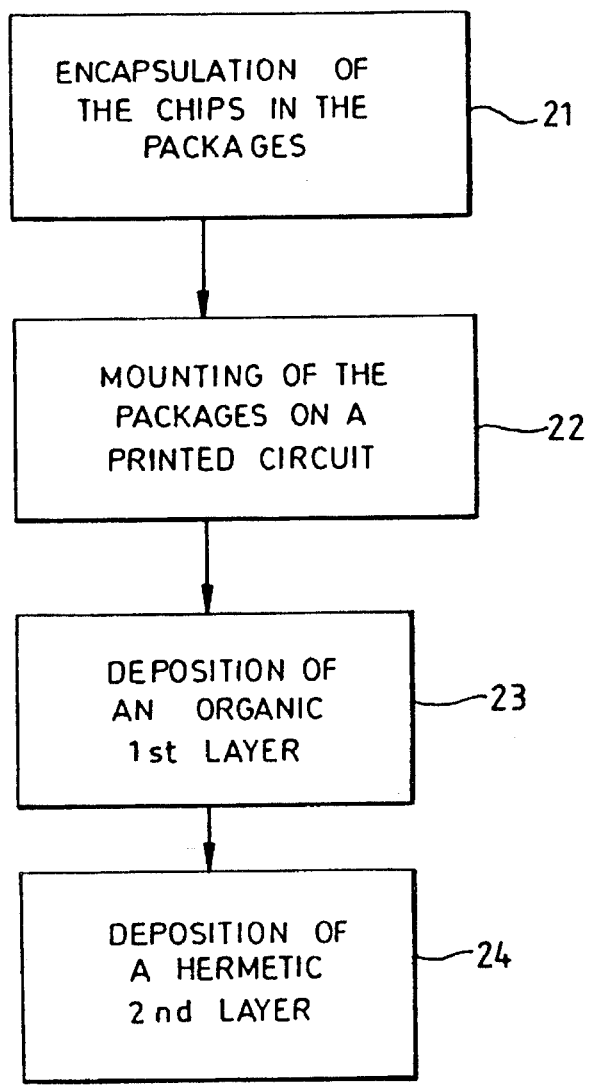
FIG. 2, the various stages of a method of implementing of the process according to the invention.

In a second step, referred to as 22 in FIG. 2, the above packages are also conventionally mounted on a printed circuit substrate (or board), referenced 50 in FIG. 1. According to the invention and as above, it is possible to employ any type of printed circuit, ceramic or epoxy, single-layer or multilayer, single-faced or double-faced, and the size of which is not limited. For example, the figure shows a multilayer board comprising a plurality of internal connecting planes, referenced 52, and double-faced, the components 10 and/or 11 being arranged at the same time on the upper face (53) and on the lower face (54) of the board 50. In addition, the printed circuit substrate 50 comprises metallised holes 51 for those of the packages (11) which comprise connecting lugs (12).

The next step (23 in FIG. 2) consists in depositing on substantially the whole of the printed circuit and the packages 10 and 11 a first layer 30 consisting of an organic compound. By way of example, a material known by the name of Parylene, produced by Union Carbide, is suitable. A silicone, epoxy or acrylic varnish is also suitable. Its function is substantially to smooth the surface on which the following layer will be deposited; smoothing in this case means producing a certain blunting of the angles and a certain levelling of the surface and a filling of the interstices (especially between components 10 or 11 and the printed circuit surface 50), to form a substantially uniform surface making it easier to deposit the next coat and allowing the latter to be very thin without the risk of crazing. For this purpose, this first layer is preferably of a relatively high thickness (typically few tens of microns).

The next step (24 in FIG. 2) consists in depositing over substantially the whole of the layer 30 a second layer, referenced 40, of a hermetic inorganic material. This layer may typically consist of a metal compound and can be very thin (typically a few microns) by virtue of the presence of the first layer. Since the cost of manufacture of the deposit of a layer such as 40 is higher than that of the layer 30, this constitutes an advantage. By way of example, a metal oxide (for example aluminium, silicon, zirconium, titanium or tin oxide) or a metal nitride (for example silicon nitride) are suitable. This layer may be obtained either by direct deposition of the metal compound or by deposition of the metal, which is then oxidised and/or nitrided by any known means. Furthermore, in the case where the material chosen for producing the layer 40 is an electrical conductor, the material of the layer 30 will additionally need to be electrically insulating.

Figure 3:
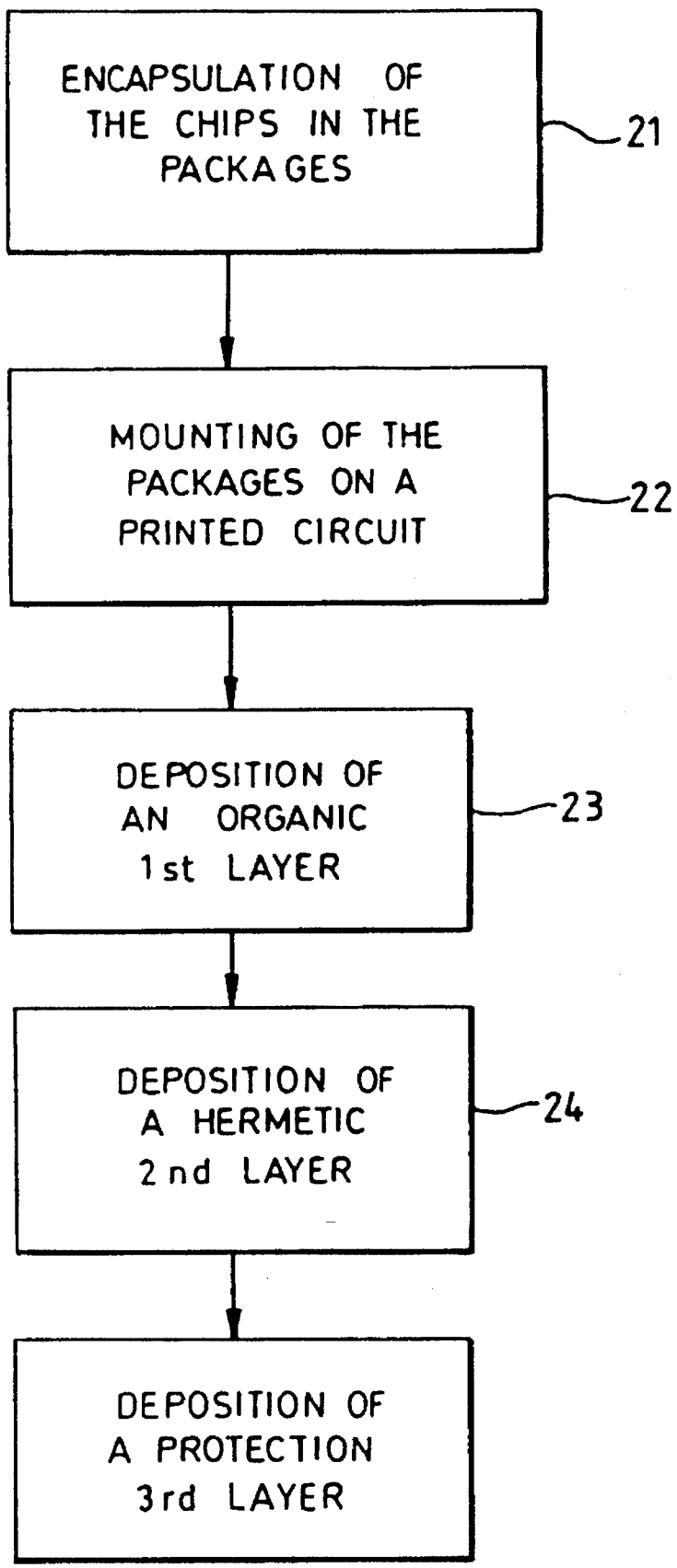
FIG. 3, the various stages of implementing an alternative embodiment of a method implementing the process according to the invention.
Figure 4:
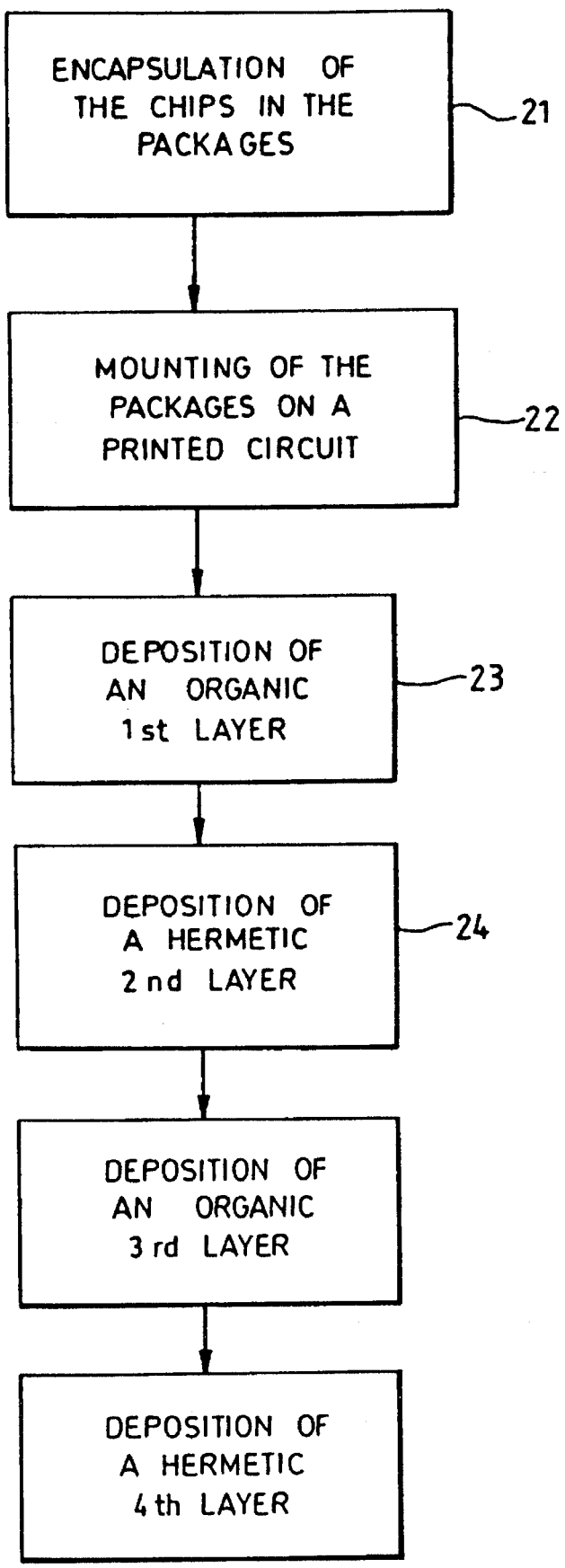
FIG. 4, the various stages of a method of another embodiment implementing the process according to the invention.
Figure 5:
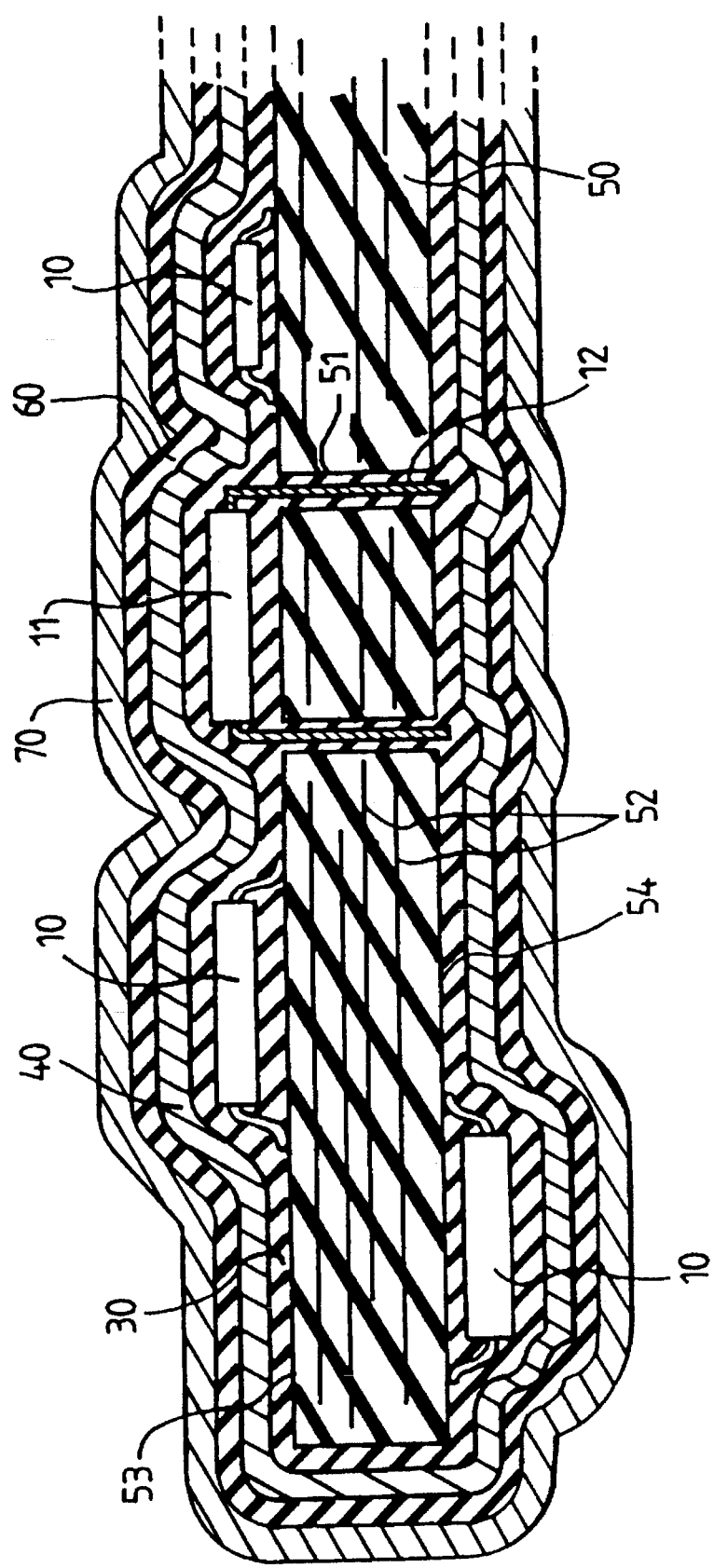
FIG. 5, a drawing similar to FIG. 1, but showing an alternative embodiment.

In an alternative embodiment in FIGS. 3, 4 and 5, a third layer 60 is deposited on the inorganic layer 40, for mechanical protection; in fact, if the layer 40 is very thin, it may be preferable to protect it against impacts or scratches. By way of example, this third layer may consist of a thin layer (typically approximately from 5 to 10 µ) of Parylene.

According to another embodiment, the third layer 60 of an organic material such as Parylene is deposited, still on the layer 40, and then a fourth layer 70 of inorganic material such as that constituting the layer 40 (for example $SiO_2$); the second-fourth layers then form a sandwich structure which exhibits a reinforced mechanical strength.

It should be noted that the presence of the first layer 30 under the layer 40 makes it additionally possible, if need be, to easily free the parts which are thus covered and which should not be so, such as adjustable components or switches. In addition, it makes it possible, for example by localised laser machining, to produce small holes permitting the application of a test probe, without compromising the sealing of the whole board.

The process described above can be employed in the same way for producing the hermetic sealing of a single package not mounted on a printed circuit board; only the step 22 of FIG. 2 is then dispensed with.

Its advantage is especially the repair of a board; in this case, the package(s) out of order can be replaced, for example by plastic packages covered with the two layers described above before being mounted on the board.

In the same way, the process according to the invention can also be applied for producing the hermetic protection of an individual component, mounted or unmounted on a printed circuit board. In the latter case, the steps 21 and 22 of FIG. 2 are dispensed with and the component is coated directly with the two layers to which the steps 23 and 24 apply, respectively. In the former case, the step 21 of FIG. 2 is dispensed with; the components are mounted on the printed circuit and then covered with the two above layers, organic followed by inorganic.

It thus appears that the invention makes it possible in particular to produce the hermetic sealing of the two faces of any circuit mounted on a printed circuit, without the need for modification of the latter, especially of fitting or of material. It also permits a local repair without destroying the hermetic sealing of the remainder of the circuit carried by the board, the replacement component(s) being also made hermetic by the same method. In addition, since the layers thus deposited are relatively thin in relation to the thickness of the circuit itself, they do not form an obstacle to the removal of the heat produced by the operation of the components. Finally, since these various layers are transparent when thin, the circuit markings are visible through the layers and there is no need to reproduce them on the outer layer.

We claim:

1. Device for hermetic encapsulation of electronic components, comprising packages enclosing electronic components, a printed circuit board on which the packages are mechanically mounted and electrically connected, a first layer of a deposited organic material covering the whole of the board and the packages except where needed to make contacts;

a second layer of a deposited hermetic inorganic material covering the first layer.

2. The device according to claim 1, wherein the first layer is selected from the group which consists of Parylene and varnish.

3. The device according to claims 1 or 2, wherein the second coating layer comprises an aluminum, silicon, zirconium, titanium or tin oxide.

4. The device according to either of claims 1 and 2, wherein the second coating layer comprises silicon nitride.

5. A hermetic encapsulation of at least one electronic component, comprising an electronic component, a first layer on the component, said first layer being made of a deposited organic material and of a thickness and having an outer surface shape smoother than the surface shape of the component, and a second layer on the first layer, said second layer being made of a deposited hermetic inorganic material.

6. An encapsulation according to claim 5, wherein the first layer is electrically insulating.

7. An encapsulation according to claim 5, wherein the second layer ia a metal compound.

8. The encapsulation according to claim 7, wherein the second layer comprises a metal oxide, metal nitride, or metal oxynitride.

9. The encapsulation according to any one of the claims 1 or 5, additionally comprising a third layer on the second layer for mechanical protection.

10. The encapsulation according to one of claims 1 or 5, additionally comprising a third layer of an organic material on the second layer, and then of the fourth layer of an organic material on the third layer.

11. The device according to claims 1 or 5, wherein said deposited second layer is a few microns thick.

12. The device according to claims 1 or 5, wherein said deposited second layer is a few microns thick and transparent.

* * * * *